United States Patent [19]

Larson

[11] 4,417,114

[45] * Nov. 22, 1983

[54] CONNECTOR FOR ATTACHING AN ELECTRICAL COMPONENT TO A FLAT SHEET

[75] Inventor: Willis A. Larson, Crystal Lake, Ill.

[73] Assignee: Oak Industries Inc., Rancho Bernardo, Calif.

[*] Notice: The portion of the term of this patent subsequent to Mar. 16, 1999 has been disclaimed.

[21] Appl. No.: 348,998

[22] Filed: Feb. 16, 1982

Related U.S. Application Data

[63] Continuation of Ser. No. 228,319, Jan. 26, 1981.

[51] Int. Cl.³ ............................................. H01H 9/02
[52] U.S. Cl. ..................................... 200/317; 200/310; 361/48
[58] Field of Search ...................... 200/317, 310, 314; 361/48

[56] References Cited

U.S. PATENT DOCUMENTS

| | | | |
|---|---|---|---|
| 3,766,350 | 10/1973 | Van Dyk et al. | 200/314 |
| 4,163,138 | 7/1979 | Harden | 200/310 |
| 4,225,766 | 9/1980 | Pfeifer et al. | 200/314 |

Primary Examiner—John W. Shepperd
Assistant Examiner—Renee S. Kidorf
Attorney, Agent, or Firm—Kinzer, Plyer, Dorn & McEachran

[57] ABSTRACT

This invention relates to an arrangement for attaching discrete electrical components to a generally flat layer of sheet material. Both mechanical and electrical connections are provided by the attachment elements of the present invention. One form of the invention is directed to a membrane switch keyboard wherein one of the layers of the membrane switch has a tail extending therefrom. The tail has a free end which is adhesively secured to some portion of the keyboard. Conductive traces are formed on the tail and extend to the free end where they contact the leads of an electrical component. The component is held between the tail and the keyboard. In another aspect, which may be applied to the membrane switch keyboard just described, the invention includes a sheet material having two or more slits cut therein for each of the component's leads. The slits are cut in a portion of the sheet having conductive traces formed thereon. The leads of the component are then interlaced through the tabs created by the slits to both mechanically and electrically connect the component to the sheet.

2 Claims, 4 Drawing Figures

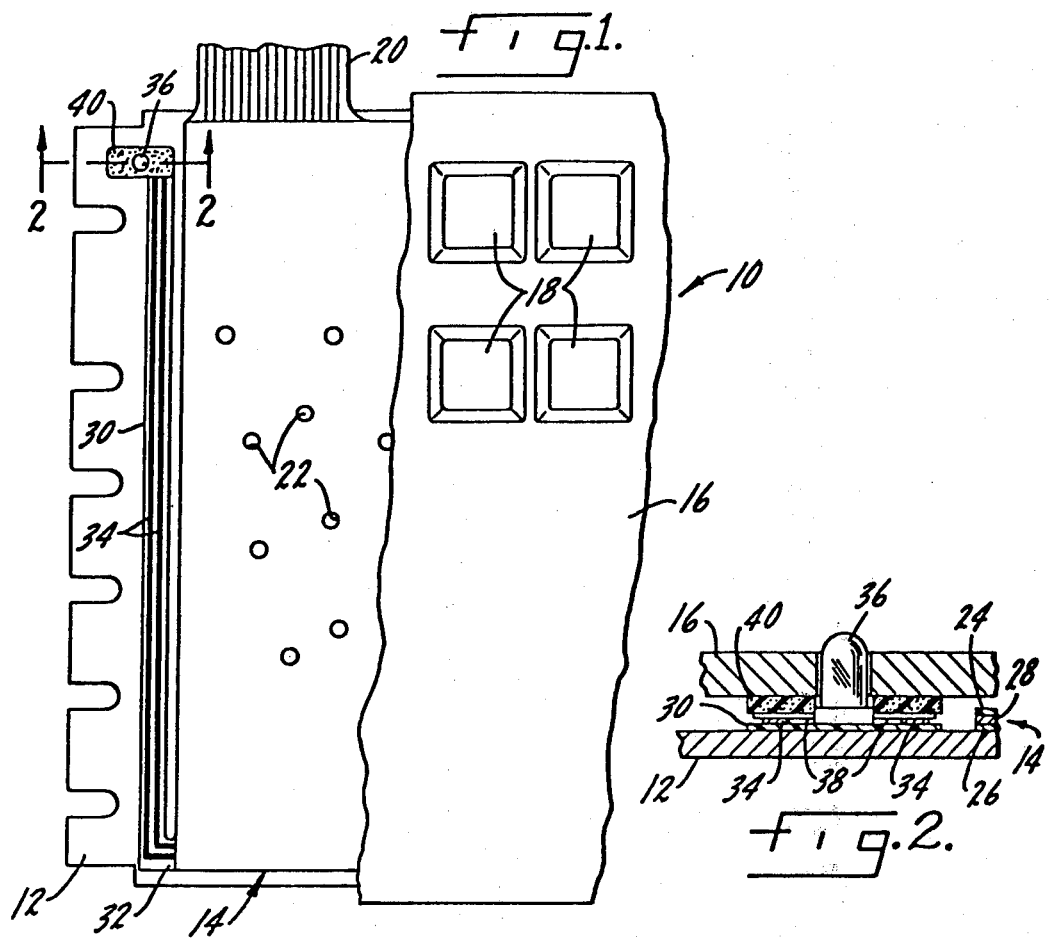
Fig. 1.
Fig. 2.
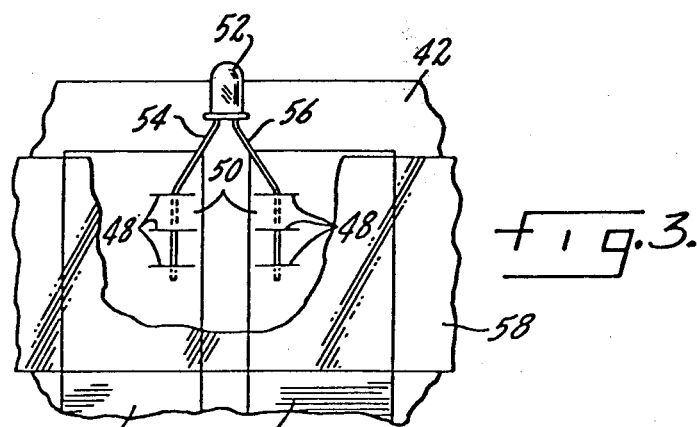
Fig. 3.
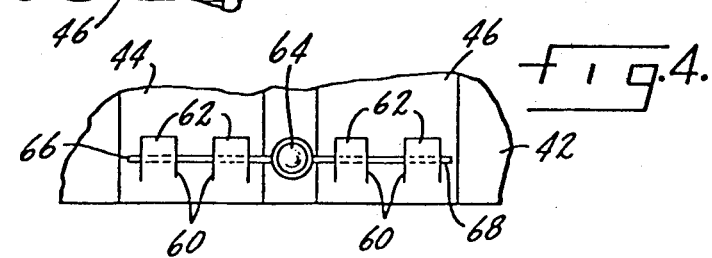
Fig. 4.

CONNECTOR FOR ATTACHING AN ELECTRICAL COMPONENT TO A FLAT SHEET

This is a continuation of application Ser. No. 228,319, filed Jan. 26, 1981.

SUMMARY OF THE INVENTION

This invention relates to electrical connectors and is particularly concerned with the problem of attaching leads of an electrical component to a generally flat member such as a membrane switch.

One of the objects of the present invention is an electrical connection for attaching discrete electrical components to generally flat members, which connection is easy to make and reliable in operation.

Another object is an electrical connection which is inexpensive to form.

Another object is an electrical connection for membrane switch keyboards which permits connection to a component in a plane other than that of the membrane switch.

Another object is an electrical connector which utilizes the inherent tendency of sheet material to remain in a flat condition to assist in securing the component.

Another object is an electrical connection which is sealed from exposure to the elements.

Other objects will appear in the following specification, drawings and claims.

BRIEF DESCRIPTION OF THE DRAWINGS

FIG. 1 is a top plan view of a membrane switch keyboard, with portions cut away, showing one form of connector according to the present invention.

FIG. 2 is a section taken generally along line 2—2 of FIG. 1.

FIG. 3 is a top plan view of a connector according to the present invention.

FIG. 4 is a view similar to FIG. 3, showing a connector adapted for an alternate type of component.

DESCRIPTION OF A PREFERRED EMBODIMENT

This invention is concerned with electrical connections to a piece of sheet material having electrical conductors formed thereon. The invention is particularly adapted for connection of discrete electrical components to a membrane switch panel. The invention is also directed to connection of discrete electrical components to single-thickness sheets which are not necessarily part of a membrane switch. The sheets have conductive traces formed thereon which contact the leads of the electrical component.

Membrane switches are currently used in a variety of applications including typewriter-like keyboards, hand-held calculators, appliance control panels and cash-registers. Frequently it is desirable to illuminate a portion of a membrane switch panel to provide information to the user. This can be accomplished by the use of a light emitting diode (LED) connected to the circuitry printed on the membrane switch. The problem then becomes how to connect the leads of an LED, which are wires, to the conductive traces on the membrane switch which are generally silk-screened or painted on thin layers of plastic.

FIG. 1 shows the connection of the present invention used in a membrane switch keyboard. The keyboard is shown generally at 10 and includes a base plate 12, a membrane switch panel 14, a bezel 16 and keys or actuators 18. The baseplate 12 is formed by rigid material such as aluminum. It forms the support for the keyboard and has appropriate notches or holes suitable for mounting the keyboard in some device. The membrane switch 14 may have one or more tails 20 with conductive traces extending onto it for connection to external circuitry. The membrane switch also has a plurality of holes 22 in line with similar holes in the baseplate 12. The holes receive legs (not shown) on the housings of the keys 18. The legs may be heat staked to fasten the keys to the baseplate.

Looking at FIG. 2, the membrane switch 14 includes a membrane layer 24, a substrate layer 26 and a spacer 28 between them. The membrane switch layers are preferably formed of thin sheets of plastic material although it could be made of other materials. The details of the membrane switch itself are conventional and are not specifically shown. The bezel 16 is an overlay which covers the membrane switch 14 and provides a uniform, finished appearance for the keyboard. The bezel has holes (not shown) which accommodate the keys 18.

As stated above, it is often desired to provide illumination of the keyboard. FIGS. 1 and 2 illustrate how this can be accomplished with the present invention. A tail 30 extends from either the membrane layer or the substrate layer. In the embodiment shown the tail 30 extends from the substrate 26. The tail 30 has one end attached to the substrate as at 32. The other or free end of the tail 30 can be attached wherever required. In this embodiment the free end is attached to the bezel 16. The tail 30 includes conductive traces 34 which may be painted or silk-screened or otherwise formed on it. An electrical component such as an LED 36 is positioned between the tail 30 and the bezel portion of the keyboard. The bezel may have a small opening for the bulb portion of the LED. The leads 38 of the LED contact the traces 34 on the tail. The tail is adhesively secured to the keyboard, in this case to the bezel 16, with the component disposed between the tail and the keyboard so that the tail holds the component in place. In a preferred embodiment a pad 40 of resilient material is placed between the tail and the keyboard to compensate for any unevenness in the keyboard or the tail. It will be understood that adhesive material is applied to the tail and to the pad so that the tail is securely held in place.

It will be noted that the free end of the tail is not restricted to the plane of the membrane switch 14. It can be connected at locations outside of the plane of the switch. For example, it may be desirable to connect the tail directly to the underside of a keytop to illuminate a specific key. Similarly, the tail need not be parallel to the edge of the membrane switch as shown in FIG. 1. It could be arranged at an angle or it could be folded as required to locate the free end of the tail at a desired position. If a tail were folded, one of the connections described below could be used to connect the LED to traces located on the opposite side of the tail from where the LED is positioned.

FIG. 3 shows another form of connector for attaching a discrete electrical component to a piece of sheet material. The sheet material could be a tail portion of a membrane switch such as at 30 in FIG. 1 or it could be any other piece of flat material used in an electrical circuit. The sheet material 42 is preferably formed of insulative material such as plastic, paper or the like. Conductive traces 44 and 46 are formed on the sheet.

The traces may be conductive ink applied by silk-screening, painting or similar method. A series of slits 48 are cut in the sheet 42. The slits extend at least partially, and in the embodiment shown wholly, within the area of the conductive traces 44 and 46. The slits define tabs 50 between them. The LED 52 has leads 54 and 56 which are interlaced through the slits to hold the component on the sheet material 42. Since the natural tendency of the sheet material 42 is to lie flat, the tabs 50 will tend to close on the leads 54 and 56. This natural tendency will therefore serve to maintain contact between the conductive traces 44 and 46 and the leads 54 and 56, respectively. If desired, the LED 52 can also be secured by placing a piece of tape 58 over the area of the connection. Also, the tape will seal the area so that there will not be any exposure of the conductive material to the elements.

FIG. 4 shows a variation of the connection of FIG. 3. In this version U-shaped slits 60 are cut in the area of the traces 44 and 46. The slits 60 form fingers 62 which can be bent upwardly, out of the plane of the sheet 42, to receive the leads of an LED. This permits accommodation of an LED 64 having horizontal leads 66 and 68. The leads 66 and 68 are placed under the fingers 62. The fingers are then pressed back into the sheet 42 to hold the component to the sheet and insure electrical contact between the conductive traces and the leads. As in the embodiment of FIG. 3, the finger 62 and the LED 64 may be secured by placing a piece of tape over them. It will be understood that other types of components could be used in the connection of the present invention and that the number of slits could be other than as shown similarly, other changes could be made in the site and ddisposition of parts without departing from the spirit and scope of the invention.

I claim:

1. A connector for attaching an electrical component to a piece of sheet material including conductive traces formed on the sheet material, at least two slits in the sheet, at least one lead of the electrical component being interlaced through the slits to hold the component on the sheet material, at least one lead of the electrical component being in electrical and mechanical contact with at least one conductive trace formed on the sheet material.

2. A connector for attaching an electrical component to a piece of sheet material including conductive traces formed on the sheet material, at least one U-shaped slit in the sheet material, the U-shaped slit forming a finger, at least one lead of the electrical component being interlaced between the sheet and the finger to hold the component on the sheet material, at least one lead of the electrical component being in electrical and mechanical contact with a conductive trace formed on the sheet material.

* * * * *